United States Patent
Lin et al.

(10) Patent No.: US 10,771,064 B1
(45) Date of Patent: Sep. 8, 2020

(54) INJECTION LOCKED FREQUENCY DIVIDER

(71) Applicant: NATIONAL CHI NAN UNIVERSITY, Nantou (TW)

(72) Inventors: Yo-Sheng Lin, Nantou (TW); Kai-Siang Lan, Nantou (TW)

(73) Assignee: NATIONAL CHI NAN UNIVERSITY, Nantou (TW)

( * ) Notice: Subject to any disclaimer, the term of this patent is extended or adjusted under 35 U.S.C. 154(b) by 0 days.

(21) Appl. No.: 16/580,550

(22) Filed: Sep. 24, 2019

(30) Foreign Application Priority Data

Jul. 2, 2019 (TW) .............................. 108123316 A

(51) Int. Cl.
*H03K 21/02* (2006.01)
*H03D 7/12* (2006.01)

(52) U.S. Cl.
CPC ........... *H03K 21/023* (2013.01); *H03D 7/125* (2013.01)

(58) Field of Classification Search
None
See application file for complete search history.

(56) References Cited

U.S. PATENT DOCUMENTS

| | | | | |
|---|---|---|---|---|
| 7,629,859 B2 * | 12/2009 | Rai | ....................... | H03B 5/1847 331/117 R |
| 7,659,784 B2 * | 2/2010 | Jang | ....................... | H03B 19/14 331/117 R |
| 8,305,116 B2 * | 11/2012 | Jang | ..................... | H03B 5/1228 327/115 |
| 8,390,343 B2 * | 3/2013 | Chang | .................. | H03B 5/1215 327/113 |
| 10,298,176 B2 * | 5/2019 | Lin | ......................... | H03D 7/125 |
| 10,491,227 B1 * | 11/2019 | Lin | ....................... | H03B 5/1228 |

* cited by examiner

*Primary Examiner* — Jeffery S Zweizig
(74) *Attorney, Agent, or Firm* — Womble Bond Dickinson (US) LLP

(57) ABSTRACT

An injection locked frequency divider includes: a resonator circuit including first to fourth inductors; and a mixer circuit receiving an input signal with an input frequency. Each of the third and fourth inductors is coupled between a respective one of the first and second inductors and the mixer circuit. The two circuits cooperate to form a tank circuit having a free-running frequency and defining a frequency locking range which is around three times the free-running frequency and within which the input frequency falls. By at least performing mixing with a differential reference signal pair, the mixer circuit generates, based on the input signal, a differential mixed signal pair with a frequency that is one-third the input frequency.

13 Claims, 6 Drawing Sheets

INJECTION LOCKED FREQUENCY DIVIDER

CROSS-REFERENCE TO RELATED APPLICATION

This application claims priority of Taiwanese Patent Application No. 108123316, filed on Jul. 2, 2019.

FIELD

The disclosure relates to an injection locked frequency divider, and more particularly to a divide-by-three injection locked frequency divider.

BACKGROUND

Referring to FIG. 1, a conventional divide-by-three injection locked frequency divider (ILFD) includes a resonator circuit 11, a mixer circuit 12 and two buffers 13, and performs frequency division on an input voltage signal ($V_{inj}$) with an input frequency to generate a differential output voltage signal pair ($V_{out1}$, $V_{out2}$) with a frequency that is one-third the input frequency.

The resonator circuit 11, the mixer circuit 12 and the buffers 13 cooperate to form a tank circuit that has a free-running frequency and that defines a frequency locking range which is around three times the free-running frequency and within which the input frequency falls. The resonator circuit 11 includes two inductors 111. The mixer circuit 12 includes four transistors 121-124 and other elements, and mixes the input voltage signal ($V_{inj}$) with a differential reference voltage signal pair to generate a differential mixed voltage signal pair, where the differential reference voltage signal pair has a frequency that is twice a frequency of the differential mixed voltage signal pair, and where the frequency of the differential mixed voltage signal pair is one-third the input frequency. The buffers 13 cooperatively buffer the differential mixed voltage signal pair to generate the differential output voltage signal pair ($V_{out1}$, $V_{out2}$).

A width of the frequency locking range (l$r$) can be expressed by the following equation:

$$lr \approx \frac{f_{osc}}{2 \cdot \Pi \cdot Q} \cdot \frac{I_{inj}}{I_{dc}} \cdot \frac{\alpha_2}{\alpha_1}, \quad \text{Equation 1}$$

where $f_{osc}$ denotes the free-running frequency, Q denotes a quality factor of the conventional ILFD, $I_{inj}$ denotes an injection current that flows into the conventional ILFD and that corresponds to the input voltage signal ($V_{inj}$), $I_{dc}$ denotes a total DC bias current that is required by the transistors 121-124 and that is a sum of drain currents of the transistors 121-124, $\alpha_1$ denotes a small signal conversion gain of each of the transistors 121, 122, and $\alpha_2$ denotes a small signal second order term coefficient that reflects second order nonlinearity of each of the transistors 121, 122.

For the conventional ILFD, the free-running frequency ($f_{osc}$) is low and the small signal second order term coefficient ($\alpha_2$) is small, so the frequency locking range is narrow. Although the total DC bias current ($I_{dc}$) can be increased to thereby increase the small signal second order term coefficient ($\alpha_2$) and thus the width of the frequency locking range (l$r$), the increase of the total DC bias current ($I_{dc}$) also leads to decrease of the width of the frequency locking range (l$r$) and increase of power consumption of the conventional ILFD. As a consequence, the width of the frequency locking range (l$r$) is increased slightly, but the power consumption is increased significantly.

SUMMARY

Therefore, an object of the disclosure is to provide an injection locked frequency divider that has a wide frequency locking range and low power consumption.

According to the disclosure, the injection locked frequency divider includes a resonator circuit and a mixer circuit. The resonator circuit includes a first inductor, a second inductor, a third inductor and a fourth inductor. Each of the first to fourth inductors has a first terminal and a second terminal. The second terminals of the first and second inductors are respectively coupled to the first terminals of the third and fourth inductors. The mixer circuit is for receiving an input voltage signal with an input frequency, is coupled to the second terminals of the third and fourth inductors, and cooperates with the resonator circuit to form a tank circuit that has a free-running frequency and that defines a frequency locking range which is around three times the frequency-running frequency, such that the input frequency falls within the frequency locking range. By at least performing mixing with a differential reference voltage signal pair, the mixer circuit generates a differential mixed voltage signal pair at the second terminals of the third and fourth inductors based on the input voltage signal. The differential mixed voltage signal pair has a frequency that is one-third the input frequency, and is to be outputted at the first terminals of the third and fourth inductors.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
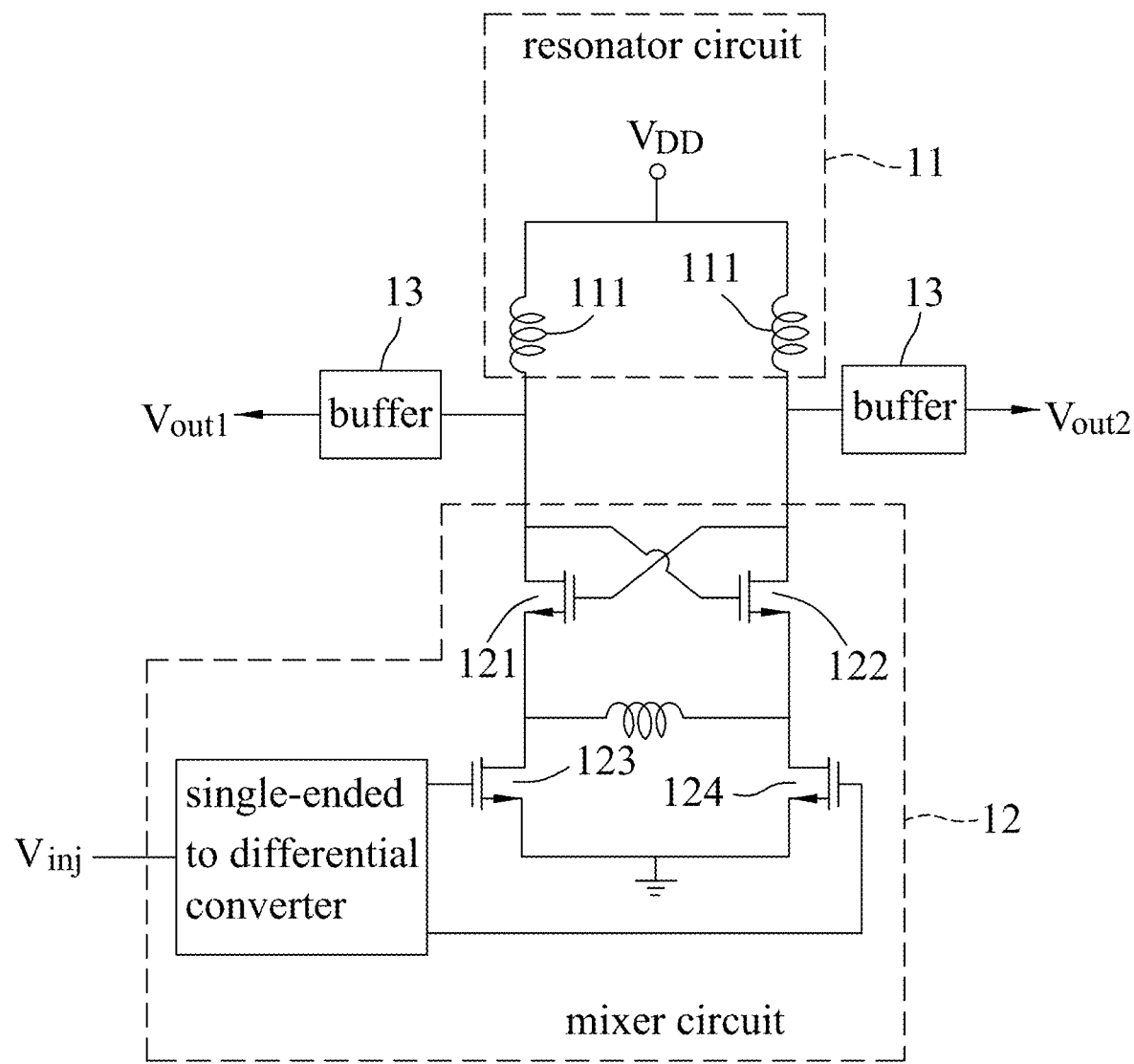
FIG. 1 is a circuit block diagram illustrating a conventional injection locked frequency divider (ILFD)

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
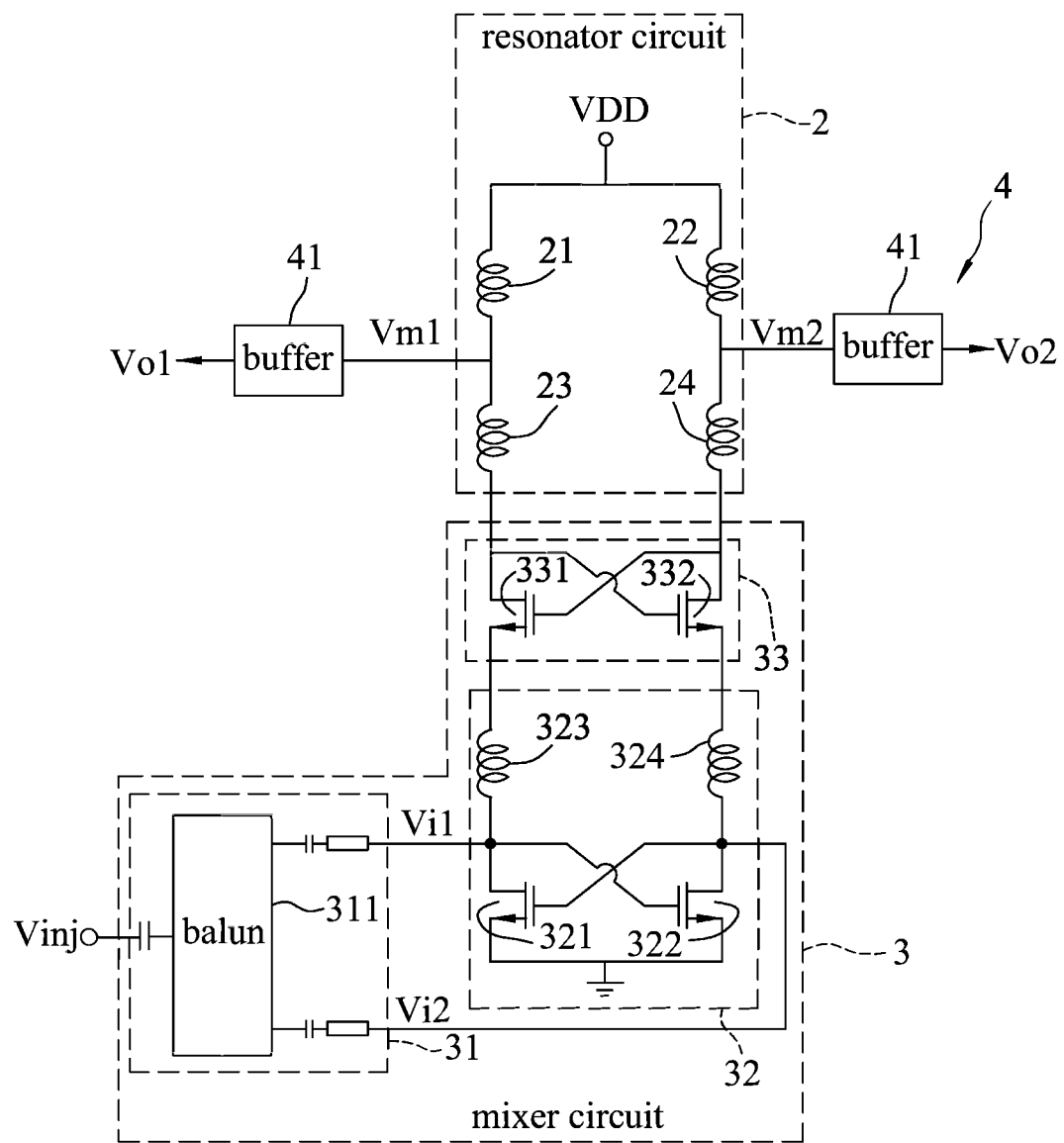
FIGS. 2 and 3 are circuit block diagrams illustrating a first embodiment of an ILFD according to the disclosure.
Figure 3:
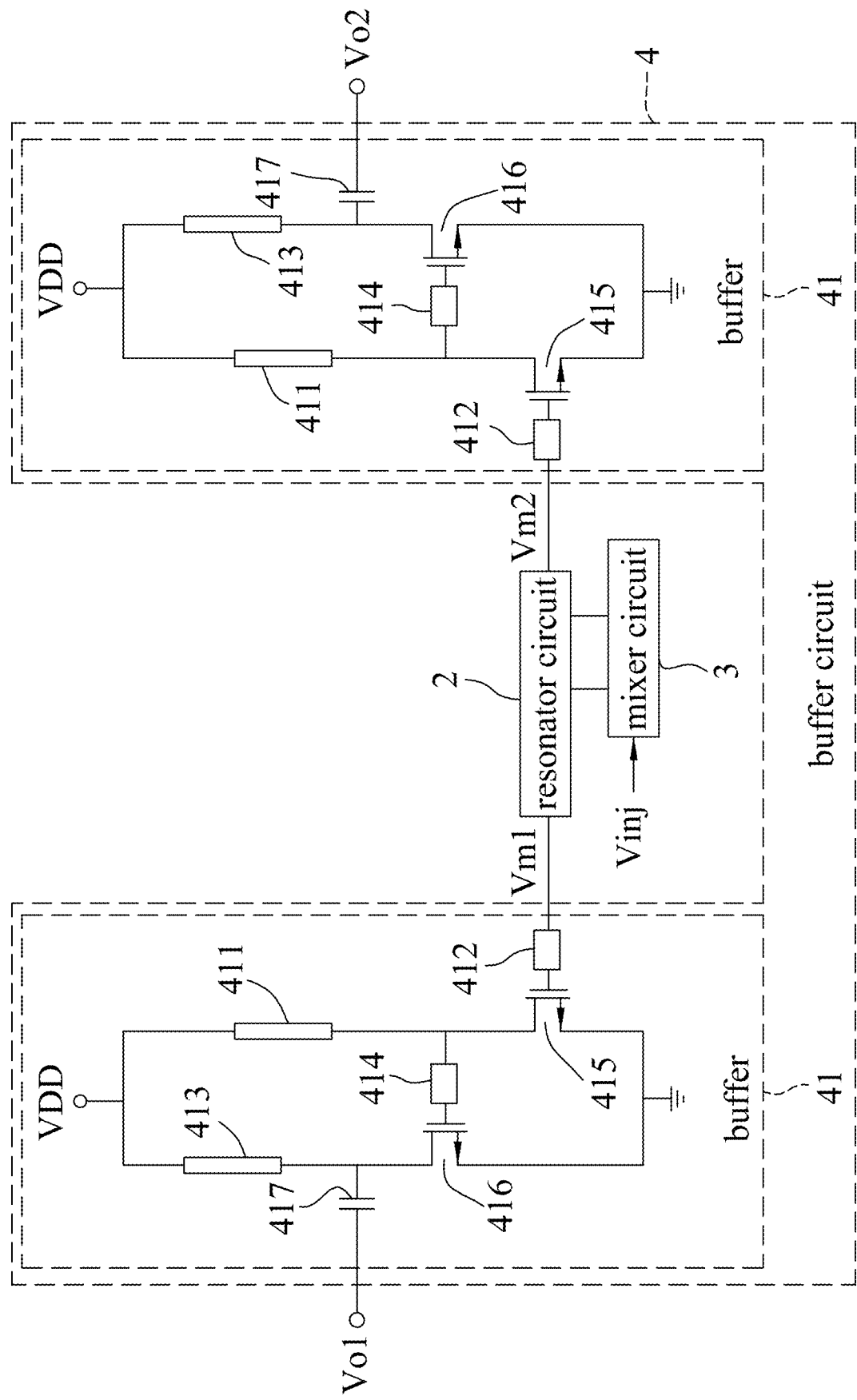

Referring to FIGS. 2 and 3, a first embodiment of an injection locked frequency divider (ILFD) according to the disclosure includes a resonator circuit 2, a mixer circuit 3 and a buffer circuit 4.

The resonator circuit 2 includes a first inductor 21, a second inductor 22, a third inductor 23 and a fourth inductor 24. Each of the first to fourth inductors 21-24 has a first terminal and a second terminal. The first terminals of the first and second inductors 21, 22 are coupled to each other, and are for receiving a supply voltage (VDD). The second terminals of the first and second inductors 21, 22 are respectively coupled to the first terminals of the third and fourth inductors 23, 24. The mixer circuit 3 is coupled to the second terminals of the third and fourth inductors 23, 24. The buffer circuit 4 is coupled to the first terminals of the third and fourth inductors 23, 24.

The mixer circuit 3 is for receiving an input voltage signal (Vinj) with an input frequency, and cooperates with the resonator circuit 2 and the buffer circuit 4 to form a tank circuit that has a free-running frequency and that defines a frequency locking range which is around three times the free-running frequency, such that the input frequency falls within the frequency locking range. By performing mixing with a differential first reference voltage signal pair, the mixer circuit 3 generates a differential mixed voltage signal pair (Vm1, Vm2) at the second terminals of the third and fourth inductors 23, 24 based on the input voltage signal (Vinj), where the differential first reference voltage signal pair has a frequency that is twice a frequency of the differential mixed voltage signal pair (Vm1, Vm2), and where the frequency of the differential mixed voltage signal pair (Vm1, Vm2) is one-third the input frequency. The differential mixed voltage signal pair (Vm1, Vm2) includes a first mixed voltage signal (Vm1) and a second mixed voltage signal (Vm2), and is to be outputted at the first terminals of the third and fourth inductors 23, 24.

The buffer circuit 4 is for receiving the differential mixed voltage signal pair (Vm1, Vm2) from the first terminals of the third and fourth inductors 23, 24, and buffers the differential mixed voltage signal pair (Vm1, Vm2) to generate a differential output voltage signal pair (Vo1, Vo2) that includes a first output voltage signal (Vo1) and a second output voltage signal (Vo2) and that has a frequency equal to the frequency of the differential mixed voltage signal pair (Vm1, Vm2) (i.e., equal to one-third the input frequency). Therefore, the ILFD of this embodiment is a divide-by-three ILFD.

In this embodiment, the mixer circuit 3 includes a single-ended to differential converter 31, a transconductance unit 32 and a mixer 33.

The single-ended to differential converter 31 is for receiving the input voltage signal (Vinj), and converts the input voltage signal (Vinj) into a differential input voltage signal pair (Vi1, Vi2) that includes a first input voltage signal (Vi1) and a second input voltage signal (Vi2) and that has a frequency equal to the input frequency. In this embodiment, the single-ended to differential converter 31 includes a balun 311 (e.g., a Marchand balun) and other elements. The balun 311 has an input terminal that is for receiving a voltage signal related to the input voltage signal (Vinj), a first output terminal that provides a voltage signal related to the first input voltage signal (Vi1), and a second output terminal that provides a voltage signal related to the second input voltage signal (Vi2).

The transconductance unit 32 is coupled to the single-ended to differential converter 31 for receiving the differential input voltage signal pair (Vi1, Vi2) therefrom, and converts the differential input voltage signal pair (Vi1, Vi2) into a differential input current signal pair with a frequency equal to that of the differential input voltage signal pair (Vi1, Vi2) (i.e., equal to the input frequency). In this embodiment, the transconductance unit 32 includes two transistors 321, 322 and two inductors 323, 324. Each of the transistors 321, 322 has a first terminal, a second terminal and a control terminal. The second terminals of the transistors 321, 322 are grounded. The control terminals of the transistors 321, 322 are coupled to the single-ended to differential converter 31 for cooperatively receiving the differential input voltage signal pair (Vi1, Vi2) therefrom. The control terminal of the transistor 321 is further coupled to the first terminal of the transistor 322. The control terminal of the transistor 322 is further coupled to the first terminal of the transistor 321. Each of the inductors 323, 324 has a first terminal and a second terminal. The first terminals of the inductors 323, 324 cooperatively provide the differential input current signal pair. The second terminals of the inductors 323, 324 are respectively coupled to the first terminals of the transistors 321, 322.

The mixer 33 is coupled to the first terminals of the inductors 323, 324 for receiving the differential input current signal pair therefrom, is further coupled to the second terminals of the third and fourth inductors 23, 24, and mixes the differential input current signal pair with the differential first reference voltage signal pair to generate the differential mixed voltage signal pair (Vm1, Vm2) at the second terminals of the third and fourth inductors 23, 24. In this embodiment, the mixer 33 includes two transistors 331, 332. Each of the transistors 331, 332 has a first terminal, a second terminal and a control terminal. The first terminals of the transistors 331, 332 are respectively coupled to the second terminals of the third and fourth inductors 23, 24, and cooperatively provide the differential mixed voltage signal pair (Vm1, Vm2) and the differential first reference voltage signal pair. The second terminals of the transistors 331, 332 are respectively coupled to the first terminals of the inductors 322, 324 for cooperatively receiving the differential input current signal pair therefrom. The control terminal of the transistor 331 is coupled to the first terminal of the transistor 332. The control terminal of the transistor 332 is coupled to the first terminal of the transistor 331.

In this embodiment, the buffer circuit 4 includes two buffers 41. Each of the buffers 41 includes four inductors 411-414, two transistors 415, 416 and a capacitor 417. For each of the buffers 41, the inductor 411 has a first terminal that is for receiving the supply voltage (VDD), and a second terminal; the inductor 412 has a first terminal that is coupled to the first terminal of a respective one of the third and fourth inductors 23, 24 for receiving a respective one of the first and second mixed voltage signals (Vm1, Vm2) therefrom, and a second terminal; the transistor 415 has a first terminal that is coupled to the second terminal of the inductor 411, a second terminal that is grounded, and a control terminal that is coupled to the second terminal of the inductor 412; the inductor 413 has a first terminal that is for receiving the supply voltage (VDD), and a second terminal; the inductor 414 has a first terminal that is coupled to the second terminal of the inductor 411, and a second terminal; the transistor 416 has a first terminal that is coupled to the second terminal of the inductor 413, a second terminal that is grounded, and a control terminal that is coupled to the second terminal of the inductor 414; and the capacitor 417 has a first terminal that is coupled to the second terminal of the inductor 413, and a second terminal that provides a respective one of the first and second output voltage signals (Vo1, Vo2).

In this embodiment, each of the transistors 321, 322, 331, 332, 415, 416 is an N-type metal oxide semiconductor field effect transistor (nMOSFET) having a drain terminal, a source terminal and a gate terminal that respectively serve as the first, second and control terminals of the transistor; and each of the inductors 411-414 is a transmission line inductor.

In this embodiment, the first to fourth inductors 21-24 and parasitic capacitances provided by the transistors 331, 332, 415 cooperate to form the tank circuit, and resonate at the free-running frequency when the input voltage signal (Vinj) is not inputted to the mixer circuit 3. In addition, nonlinear characteristics of the transistors 331, 332 cause a plurality of harmonics to exist at the first terminal of each of the transistors 331, 332, where higher harmonic has weaker strength. Since the ILFD of this embodiment is a divide-by-three ILFD, the second harmonics at the first terminals of the transistors 331, 332 cooperatively serve as the differential first reference voltage signal pair.

In this embodiment, when the input frequency falls within the frequency locking range (i.e., being about three times the free-running frequency), the ILFD of this embodiment can perform frequency division on the input voltage signal (Vinj) normally or as intended. In an instance where the free-running frequency is 33.6 GHz, and where the frequency locking range is from 91.8 GHz to 109.8 GHz, when the input frequency falls outside the frequency locking range (i.e., being below 91.8 GHz or above 109.8 GHz), the ILFD of this embodiment may not normally perform frequency division on the input voltage signal (Vinj), so the differential mixed voltage signal pair (Vm1, Vm2) may not be successfully outputted as desired; and when the input frequency falls within the frequency locking range (e.g., being 91.8 GHz, 100.8 GHz, or 109.8 GHz), the frequency of the differential mixed voltage signal pair (Vm1, Vm2) would be locked to one-third the input frequency (i.e., 30.6 GHz, 33.6 GHz or 36.6 GHz for the corresponding example).

Theoretically, a width of the frequency locking range (LR) can be expressed by the following equation:

$$LR \approx \frac{fo}{2 \cdot \prod \cdot Q'} \cdot \frac{I_{inj'}}{I_{dc'}} \cdot \frac{\alpha_{2'}}{\alpha_{1'}}, \quad \text{Equation 2}$$

where fo denotes the free-running frequency, Q' denotes a quality factor of the ILFD of this embodiment, $I_{inj'}$ denotes an injection current that flows into the ILFD of this embodiment and that corresponds to the input voltage signal (Vinj), $I_{dc'}$ denotes a total DC bias current that is required by the transistors 321, 322, 331, 332 and that is a sum of drain currents of the transistors 321, 322, 331, 332, $\alpha_{1'}$ denotes a small signal conversion gain of each of the transistors 331, 332, and $\alpha_{2'}$ denotes a small signal second order term coefficient that reflects second order nonlinearity of each of the transistors 331, 332. According to Equation 2, higher free-running frequency (fo) leads to wider frequency locking range. This embodiment uses the inductors 21-24 to increase the free-running frequency (fo).

To make a fair comparison between the ILFD of this embodiment and the conventional ILFD, it is assumed that a total inductance and a total capacitance of the tank circuit of this embodiment are the same as those of the tank circuit of the conventional ILFD. That is to say, $L_{21}+L_{23}=L_{22}+L_{24}=L_{111}$, and C1+C2=C3, where $L_{21}-L_{24}$ respectively denote inductances of the first to fourth inductors 21-24 of this embodiment, $L_{111}$ denotes an inductance of each of the inductors 111 (see FIG. 1) of the conventional ILFD, C1 denotes the parasitic capacitance provided at the first terminal of each of the third and fourth inductors 23, 24 by the corresponding transistor 415 in this embodiment, C2 denotes the parasitic capacitance provided at the second terminal of each of the third and fourth inductors 23, 24 by the transistors 331, 332 in this embodiment, and C3 denotes a parasitic capacitance provided at a terminal of each of the inductors 111 (see FIG. 1) by the mixer circuit 12 (see FIG. 1) and the corresponding buffer 13 (see FIG. 1) in the conventional ILFD. In this embodiment, when either the parasitic capacitance (C1) or the parasitic capacitance (C2) approximates zero, the free-running frequency (fo) can be expressed by the following equation:

$$fo = \frac{1}{2 \cdot \prod \cdot \sqrt{(L_{21}+L_{23}) \cdot C2 + L_{21} \cdot C1}}. \quad \text{Equation 3}$$

The free-running frequency ($f_{osc}$) of the conventional ILFD is $$\frac{1}{2 \cdot \prod \cdot \sqrt{L_{111} \cdot C3}}.$$

According to Equation 3, when C1=0, C2=C3 and $L_{21}=L_{23}=L_{111}/2$, $$fo = \frac{1}{2 \cdot \prod \cdot \sqrt{L_{111} \cdot C3}},$$

which is equal to $f_{osc}$. In addition, when C1=C3, C2=0 and $L_{21}=L_{23}=L_{111}/2$, $$fo = \frac{1}{2 \cdot \prod \cdot \sqrt{(L_{111}/2) \cdot C3}},$$

which is greater than $f_{osc}$. Therefore, based on the aforesaid assumptions, when $L_{21}=L_{23}=L_{111}/2$, larger parasitic capacitance (C1) leads to higher free-running frequency (fo) and wider frequency locking range. In this embodiment, a gate width of each of the transistors 415 is generally greater than that of each of the transistors 331, 332, so the parasitic capacitances provided by the transistors 415 are generally greater than the parasitic capacitances provided by the transistors 331, 332. By connecting the buffers 41 respectively to the first terminals of the third and fourth inductor 24, the parasitic capacitance (C1) can be greater than the parasitic capacitance (C2), thereby attaining higher free-running frequency (fo) and wider frequency locking range. Therefore, the width of the frequency locking range (LR) of the ILFD of this embodiment can be increased by increasing the free-running frequency (fo), instead of by increasing the total DC bias current ($I_{dc'}$), so that the ILFD of this embodiment can have a wide frequency locking range and low power consumption.

Moreover, in this embodiment, the cross-coupled transistors 321, 322 can boost an amplitude of the differential input current signal pair to cause increase of the small signal second order term coefficient ($\alpha_{2'}$) and thus further increase of the width of the frequency locking range (LR).

Figure 4:
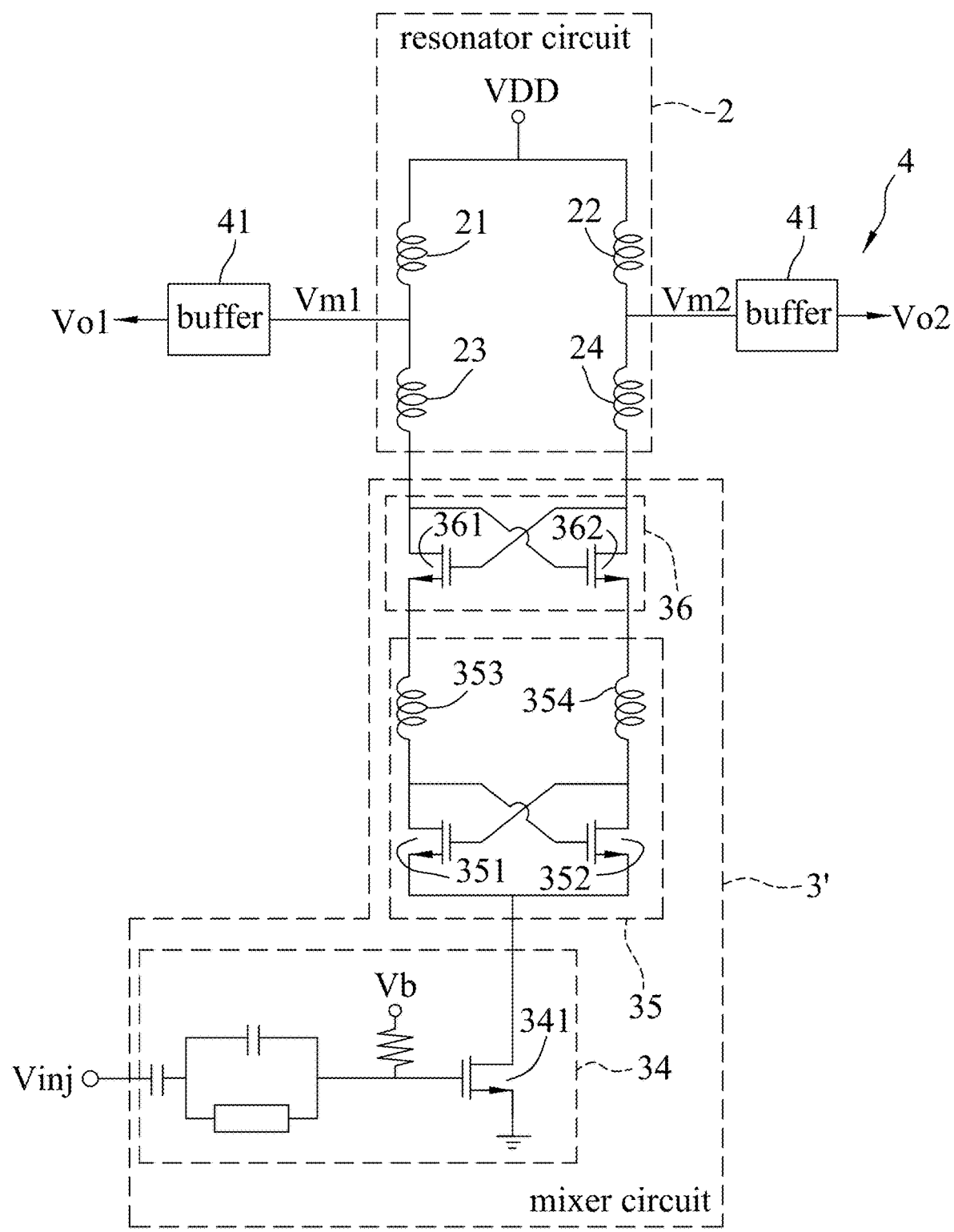
FIG. 4 is a circuit block diagram illustrating a second embodiment of the ILFD according to the disclosure.

Referring to FIG. 4, a second embodiment of the ILFD according to the disclosure is a modification of the first embodiment, and differs from the first embodiment in what are described below.

In the second embodiment, the frequency of the differential first reference voltage signal pair is equal to the frequency of the differential mixed voltage signal pair (Vm1, Vm2), instead of being twice the frequency of the differential mixed voltage signal pair (Vm1, Vm2); and the mixer circuit 3' generates the differential mixed voltage signal pair (Vm1, Vm2) by further performing mixing with a differential second reference voltage signal pair that has a frequency equal to the frequency of the differential mixed voltage signal pair (Vm1, Vm2).

In this embodiment, the mixer circuit 3' includes a transconductance unit 34, a first mixer 35 and a second mixer 36.

The transconductance unit 34 is for receiving the input voltage signal (Vinj), and converts the input voltage signal (Vinj) into an input current signal. In this embodiment, the transconductance unit 34 includes a transistor 341 and other elements. The transistor 341 has a first terminal that provides the input current signal, a second terminal that is grounded, and a control terminal that is for receiving a voltage signal related to the input voltage signal (Vinj).

The first mixer 35 is coupled to the first terminal of the transistor 341 for receiving the input current signal therefrom, and mixes the input current signal with the differential first reference voltage signal pair to generate a differential intermediate voltage signal pair that has a frequency which is twice the frequency of the differential mixed voltage signal pair (Vm1, Vm2). In this embodiment, the first mixer includes two transistors 351, 352 and two inductors 353, 354. Each of the transistors 351, 352 has a first terminal, a second terminal and a control terminal. The first terminals of the transistors 351, 352 cooperatively provide the differential intermediate voltage signal pair and the differential first reference voltage signal pair. The second terminals of the transistors 351, 352 are coupled to each other, and are further coupled to the first terminal of the transistor 341 for cooperatively receiving the input current signal therefrom. The control terminal of the transistor 351 is coupled to the first terminal of the transistor 352. The control terminal of the transistor 352 is coupled to the first terminal of the transistor 351. Each of the inductors 353, 354 has a first terminal and a second terminal. The second terminals of the inductors 353, 354 are respectively coupled to the first terminals of the transistors 351, 352.

The second mixer 36 is coupled to the first terminals of the inductors 353, 354 for receiving the differential intermediate voltage signal pair from the first terminals of the transistors 351, 352 via the inductors 353, 354, and is further coupled to the second terminals of the third and fourth inductors 23, 24. The second mixer 36 mixes the differential intermediate voltage signal pair with the differential second reference voltage signal pair to generate the differential mixed voltage signal pair (Vm1, Vm2) at the second terminals of the third and fourth inductors 23, 24. In this embodiment, the second mixer 36 includes two transistors 361, 362. Each of the transistors 361, 362 has a first terminal, a second terminal and a control terminal. The first terminals of the transistors 361, 362 are respectively coupled to the second terminals of the third and fourth inductors 23, 24, and cooperatively provide a differential voltage signal pair that serves as both the differential mixed voltage signal pair (Vm1, Vm2) and the differential second reference voltage signal pair. The second terminals of the transistors 361, 362 are coupled to the first terminals of the inductors 353, 354 for receiving the differential intermediate voltage signal pair from the first terminals of the transistors 351, 352 via the inductors 353, 354. The control terminal of the transistor 361 is coupled to the first terminal of the transistor 362. The control terminal of the transistor 362 is coupled to the first terminal of the transistor 361.

In this embodiment, each of the transistors 351, 352, 361, 362 is an nMOSFET having a drain terminal, a source terminal and a gate terminal that respectively serve as the first, second and control terminals of the transistor.

In this embodiment, the first to fourth inductors 21-24, parasitic capacitances provided by the transistors 361, 362, and parasitic capacitances provided by the transistors 415 (see FIG. 3) cooperate to form the tank circuit, and resonate at the free-running frequency when the input voltage signal (Vinj) is not inputted to the mixer circuit 3'. In addition, nonlinear characteristics of the transistors 351, 352, 361, 362 cause a plurality of harmonics to exist at the first terminal of each of the transistors 351, 352, 361, 362, where higher harmonic has weaker strength. Since the ILFD of this embodiment is a divide-by-three ILFD, the first harmonics at the first terminals of the transistors 351, 352 cooperatively serve as the differential first reference voltage signal pair, and the first harmonics at the first terminals of the transistors 361, 362 cooperatively serve as the differential mixed voltage signal pair (Vm1, Vm2).

The second embodiment also uses the inductors 21-24 to increase the free-running frequency (fo) and thus the width of the frequency locking range (LR) as does the first embodiment.

Moreover, in the second embodiment, by virtue of the first mixer 35 that mixes the input current signal with the strong first harmonics generated thereby (i.e., the differential first reference voltage signal pair) to generate the differential intermediate voltage signal pair, and by virtue of the second mixer 36 that mixes the differential intermediate voltage signal pair with the strong first harmonics generated thereby (i.e., the differential second reference voltage signal pair) to generate the differential mixed voltage signal pair (Vm1, Vm2), the small signal second order term coefficient ($\alpha_{2'}$) can be increased to cause further increase of the width of the frequency locking range (LR).

Figure 5:
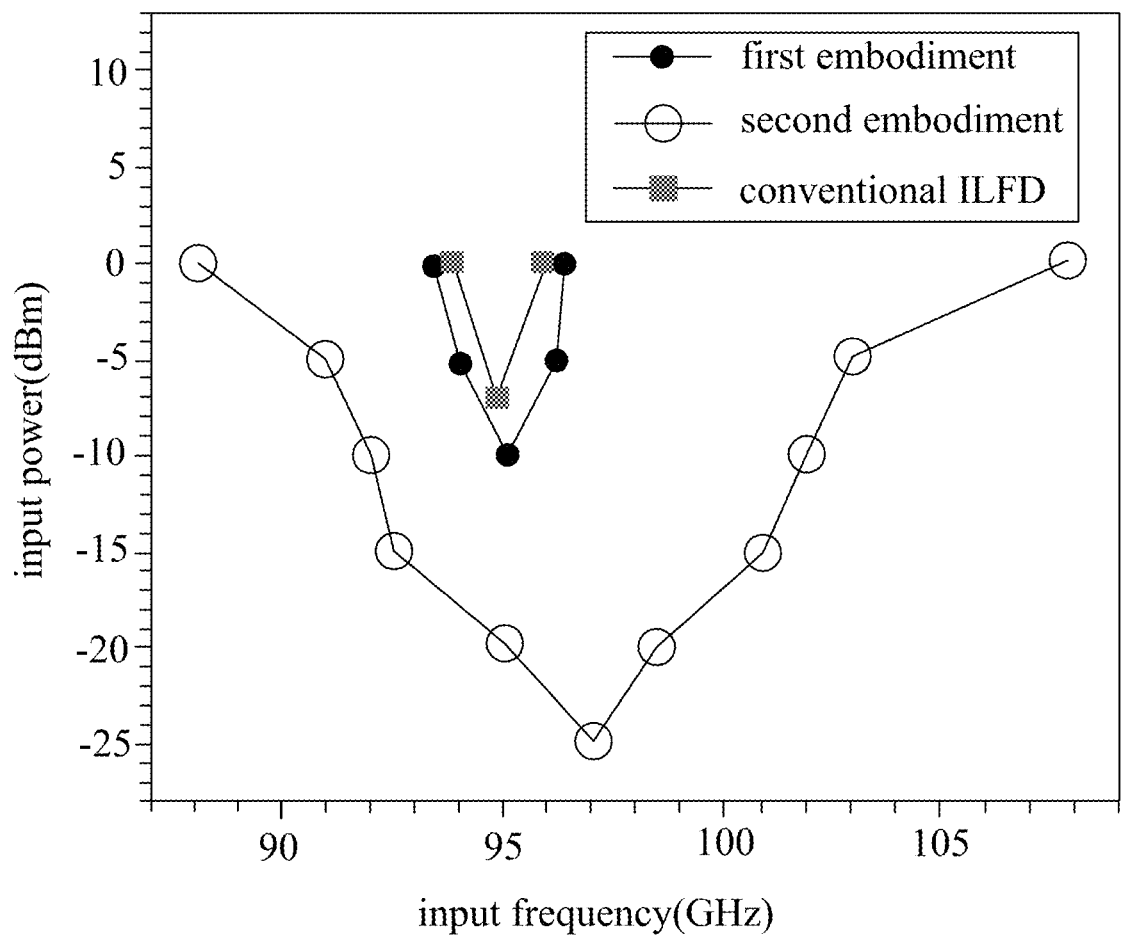
FIG. 5 is a plot illustrating simulation results of input power of the first and second embodiments and the conventional ILFD under different input frequency.

FIG. 5 illustrates simulation results of input power of the ILFD of the first embodiment, the ILFD of the second embodiment and the conventional ILFD under different input frequency, where the input power refers to power of the signal inputted to the ILFD, such as the input voltage signal ($V_{inj}$) (see FIG. 1) for the conventional ILFD and the input voltage signal (Vinj) (see FIGS. 2 and 4) for the ILFD of each of the first and second embodiments. The width of the frequency locking range of the ILFD herein is defined as the width of the frequency locking range corresponding to input power of 0 dBm. As shown in FIG. 5, for the input voltage signal having input power of 0 dBm, the frequency locking range of the ILFD of the first embodiment has a width of 3 GHz, the frequency locking range of the ILFD of the second embodiment has a width of 20 GHz, and the frequency locking range of the conventional ILFD has a width of 2 GHz. In other words, the frequency locking range of the ILFD of each of the first and second embodiments is wider than that of the conventional ILFD. Additionally, sensitivity of the ILFD is correlated to minimum input power required for the ILFD to normally perform the frequency division. The smaller the minimum input power level required for an ILFD, the better the sensitivity of the ILFD. As shown in FIG. 5, the minimum input power required for the ILFD of the first embodiment is −10 dBm, and the minimum input power required for the ILFD of the second embodiment is −25 dBm, whereas the minimum input power required for the conventional ILFD is −7 dBm.

That is to say, the ILFD of each of the first and second embodiments has better sensitivity as compared to the conventional ILFD.

Figure 6:
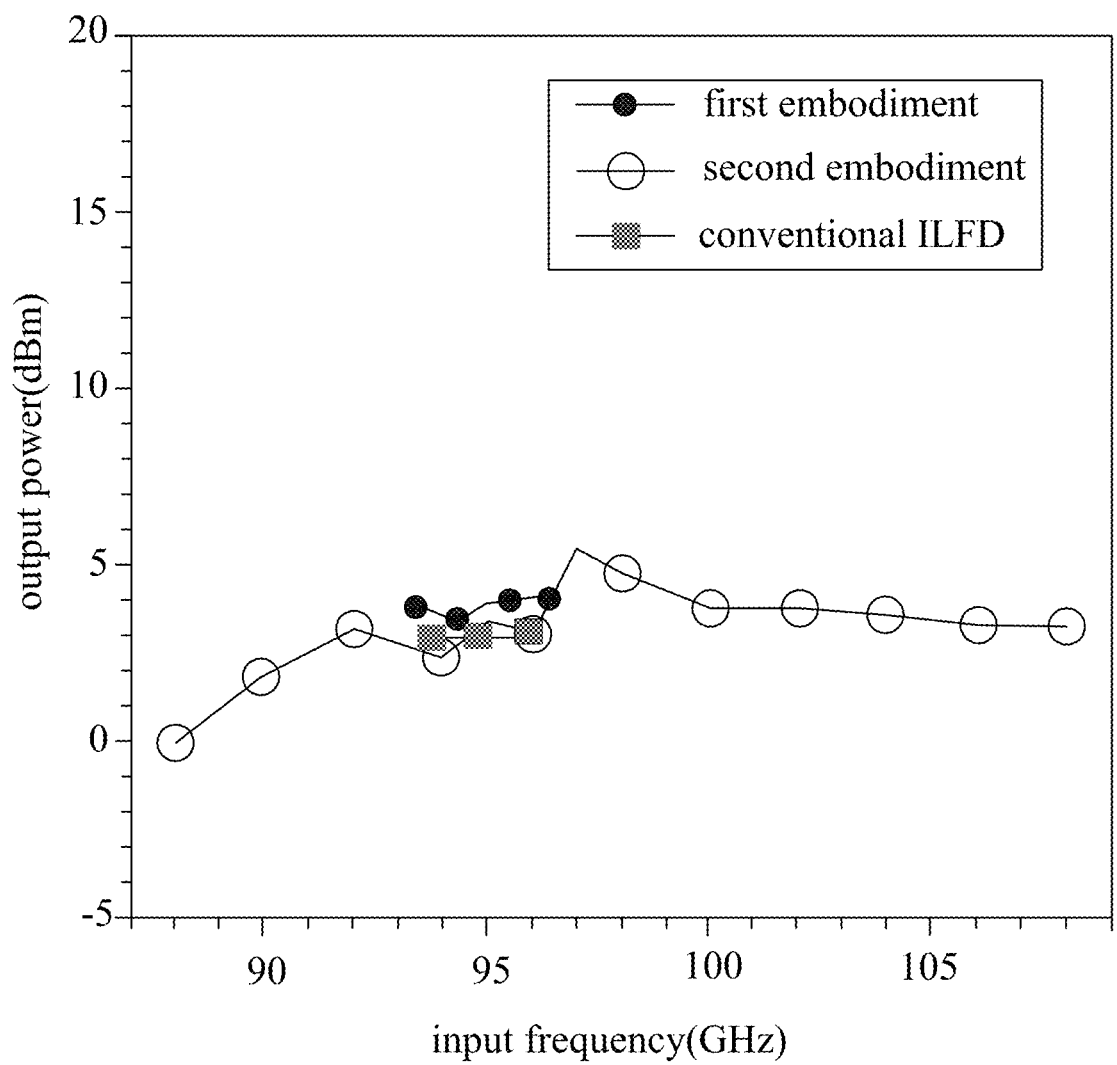
FIG. 6 is a plot illustrating simulation results of output power of the first and second embodiments and the conventional ILFD under different input frequency.

FIG. 6 illustrates simulation results of output power of the ILFD of the first embodiment, the ILFD of the second embodiment and the conventional ILFD under different input frequency, where the output power refers to power of the differential signal pair outputted by the ILFD, such as the differential output voltage signal pair ($V_{out1}, V_{out2}$) (see FIG. 1) for the conventional ILFD and the differential output voltage signal pair (Vo1, Vo2) (see FIGS. 2 and 4) for the ILFD of each of the first and second embodiments. As compared to the conventional ILFD, the ILFD of each of the first and second embodiments has lower power consumption and a wider frequency locking range while providing substantially the same output power.

Referring back to FIGS. 2 and 4, in view of the above, for each of the first and second embodiment, by virtue of the first to fourth inductors 21-24 that can increase the free-running frequency (fo), the width of the frequency locking range (LR) can be increased in the condition where the total DC bias current ($I_{dc}$) is not increased, thereby achieving low power consumption of the ILFD.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. An injection locked frequency divider comprising:
   a resonator circuit including a first inductor, a second inductor, a third inductor and a fourth inductor, each of said first to fourth inductors having a first terminal and a second terminal, said second terminals of said first and second inductors being respectively coupled to said first terminals of said third and fourth inductors; and
   a mixer circuit for receiving an input voltage signal with an input frequency, coupled to said second terminals of said third and fourth inductors, and cooperating with said resonator circuit to form a tank circuit that has a free-running frequency and that defines a frequency locking range which is around three times the free-running frequency, such that the input frequency falls within the frequency locking range;
   wherein, by at least performing mixing with a differential first reference voltage signal pair, said mixer circuit generates a differential mixed voltage signal pair at said second terminals of said third and fourth inductors based on the input voltage signal, the differential mixed voltage signal pair having a frequency that is one-third the input frequency, and being outputted at said first terminals of said third and fourth inductors.

2. The injection locked frequency divider of claim 1, wherein the differential first reference voltage signal pair has a frequency that is twice the frequency of the differential mixed voltage signal pair.

3. The injection locked frequency divider of claim 2, wherein said mixer circuit includes:
   a single-ended to differential converter for receiving the input voltage signal, and converting the input voltage signal into a differential input voltage signal pair;
   a transconductance unit coupled to said single-ended to differential converter for receiving the differential input voltage signal pair therefrom, and converting the differential input voltage signal pair into a differential input current signal pair; and
   a mixer coupled to said transconductance unit for receiving the differential input current signal pair therefrom, further coupled to said second terminals of said third and fourth inductors, and mixing the differential input current signal pair with the differential first reference voltage signal pair to generate the differential mixed voltage signal pair at said second terminals of said third and fourth inductors.

4. The injection locked frequency divider of claim 3, wherein the differential input voltage signal pair includes a first input voltage signal and a second input voltage signal, and said single-ended to differential converter includes:
   a balun having an input terminal that is for receiving a voltage signal related to the input voltage signal, a first output terminal that provides a voltage signal related to the first input voltage signal, and a second output terminal that provides a voltage signal related to the second input voltage signal.

5. The injection locked frequency divider of claim 3, wherein said transconductance unit includes:
   a first transistor and a second transistor each having a first terminal, a second terminal and a control terminal, said second terminals of said first and second transistors being grounded, said control terminals of said first and second transistors being coupled to said single-ended to differential converter for cooperatively receiving the differential input voltage signal pair therefrom, said control terminal of said first transistor being further coupled to said first terminal of said second transistor, said control terminal of said second transistor being further coupled to said first terminal of said first transistor;
   a fifth inductor and a sixth inductor each having a first terminal and a second terminal, said first terminals of said fifth and sixth inductors being coupled to said mixer, and cooperatively providing the differential input current signal pair, said second terminals of said fifth and sixth inductors being respectively coupled to said first terminals of said first and second transistors.

6. The injection locked frequency divider of claim 3, wherein said mixer includes:
   a first transistor and a second transistor each having a first terminal, a second terminal and a control terminal, said first terminals of said first and second transistors being respectively coupled to said second terminals of said third and fourth inductors, and cooperatively providing the differential mixed voltage signal pair and the differential first reference voltage signal pair, said second terminals of said first and second transistors being coupled to said transconductance unit for cooperatively receiving the differential input current signal pair therefrom, said control terminal of said first transistor being coupled to said first terminal of said second transistor, said control terminal of said second transistor being coupled to said first terminal of said first transistor.

7. The injection locked frequency divider of claim 1, wherein:
   said mixer circuit generates the differential mixed voltage signal pair by further performing mixing with a differential second reference voltage signal pair; and
   each of the differential first reference voltage signal pair and the differential second reference voltage signal pair has a frequency that is equal to the frequency of the differential mixed voltage signal pair.

8. The injection locked frequency divider of claim 7, wherein said mixer circuit includes:
   a transconductance unit for receiving the input voltage signal, and converting the input voltage signal into an input current signal;
   a first mixer coupled to said transconductance unit for receiving the input current signal therefrom, and mixing the input current signal with the differential first reference voltage signal pair to generate a differential intermediate voltage signal pair; and
   a second mixer coupled to said first mixer for receiving the differential intermediate voltage signal pair therefrom, further coupled to said second terminals of said third and fourth inductors, and mixing the differential intermediate voltage signal pair with the differential second reference voltage signal pair to generate the differential mixed voltage signal pair at said second terminals of said third and fourth inductors.

9. The injection locked frequency divider of claim 8, wherein said transconductance unit includes:
   a transistor having a first terminal that is coupled to said first mixer and that provides the input current signal, a second terminal that is grounded, and a control terminal that is for receiving a voltage signal related to the input voltage signal.

10. The injection locked frequency divider of claim 8, wherein said first mixer includes:
    a first transistor and a second transistor each having a first terminal, a second terminal and a control terminal, said first terminals of said first and second transistors cooperatively providing the differential intermediate voltage signal pair and the differential first reference voltage signal pair, said second terminals of said first and second transistors being coupled to each other, and being further coupled to said transconductance unit for cooperatively receiving the input current signal therefrom, said control terminal of said first transistor being coupled to said first terminal of said second transistor, said control terminal of said second transistor being coupled to said first terminal of said first transistor; and
    a fifth inductor and a sixth inductor each having a first terminal and a second terminal, said first terminals of said fifth and sixth inductors being coupled to said second mixer, said second terminals of said fifth and sixth inductors being respectively coupled to said first terminals of said first and second transistors, the differential intermediate voltage signal pair being outputted to said second mixer via said fifth and sixth inductors.

11. The injection locked frequency divider of claim 8, wherein said second mixer includes:
    a first transistor and a second transistor each having a first terminal, a second terminal and a control terminal, said first terminals of said first and second transistors being respectively coupled to said second terminals of said third and fourth inductors, and cooperatively providing a differential voltage signal pair that serves as both the differential mixed voltage signal pair and the differential second reference voltage signal pair, said second terminals of said first and second transistors being coupled to said first mixer for cooperatively receiving the differential intermediate voltage signal pair therefrom, said control terminal of said first transistor being coupled to said first terminal of said second transistor, said control terminal of said second transistor being coupled to said first terminal of said first transistor.

12. The injection locked frequency divider of claim 1, further comprising:
    a buffer circuit coupled to said first terminals of said third and fourth inductors for receiving the differential mixed voltage signal pair therefrom, and buffering the differential mixed voltage signal pair to generate a differential output voltage signal pair.

13. The injection locked frequency divider of claim 12, wherein the differential mixed voltage signal pair includes a first mixed voltage signal and a second mixed voltage signal, the differential output voltage signal pair includes a first output voltage signal and a second output voltage signal, said buffer circuit includes two buffers, and one of said buffers includes:
    a fifth inductor having a first terminal that is for receiving a supply voltage, and a second terminal;
    a sixth inductor having a first terminal that is coupled to said first terminal of a corresponding one of said third and fourth inductors for receiving a corresponding one of the first and second mixed voltage signals therefrom, and a second terminal;
    a first transistor having a first terminal that is coupled to said second terminal of said fifth inductor, a second terminal that is grounded, and a control terminal that is coupled to said second terminal of said sixth inductor;
    a seventh inductor having a first terminal that is for receiving the supply voltage, and a second terminal;
    an eighth inductor having a first terminal that is coupled to said second terminal of said fifth inductor, and a second terminal;
    a second transistor having a first terminal that is coupled to said second terminal of said seventh inductor, a second terminal that is grounded, and a control terminal that is coupled to said second terminal of said eighth inductor; and
    a capacitor having a first terminal that is coupled to said second terminal of said seventh inductor, and a second terminal that provides a corresponding one of the first and second output voltage signals.

\* \* \* \* \*